United States Patent
Kuah et al.

(10) Patent No.: US 11,621,181 B2
(45) Date of Patent: Apr. 4, 2023

(54) DUAL-SIDED MOLDING FOR ENCAPSULATING ELECTRONIC DEVICES

(71) Applicant: ASMPT SINGAPORE PTE. LTD., Singapore (SG)

(72) Inventors: Teng Hock Kuah, Singapore (SG); Yi Lin, Singapore (SG); Kar Weng Yan, Singapore (SG); Perez Angelito Barrozo, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 259 days.

(21) Appl. No.: 16/867,335

(22) Filed: May 5, 2020

(65) Prior Publication Data

US 2021/0351049 A1 Nov. 11, 2021

(51) Int. Cl.
*B29C 33/42* (2006.01)
*H01L 21/67* (2006.01)
*B29C 33/38* (2006.01)
*H01L 21/56* (2006.01)

(52) U.S. Cl.
CPC .... *H01L 21/67126* (2013.01); *B29C 33/3807* (2013.01); *B29C 33/42* (2013.01); *H01L 21/565* (2013.01)

(58) Field of Classification Search
CPC .. H01L 21/67126; H01L 21/565; B29C 33/42
See application file for complete search history.

(56) References Cited

U.S. PATENT DOCUMENTS

| | | | | |
|---|---|---|---|---|
| 3,666,907 A | * | 5/1972 | Nugent | H01L 21/67126 228/1.1 |
| 3,696,986 A | * | 10/1972 | Anderson | H01L 21/67126 29/25.35 |
| 4,347,211 A | * | 8/1982 | Bandoh | B29C 45/02 264/328.9 |
| 4,480,975 A | * | 11/1984 | Plummer | H01L 21/565 264/272.17 |

(Continued)

FOREIGN PATENT DOCUMENTS

| | | |
|---|---|---|
| JP | H07-124989 A | 5/1995 |
| JP | H11-274196 A | 10/1999 |
| KR | 10-1968429 B1 | 4/2019 |

OTHER PUBLICATIONS

Taiwan Office Action and Search Report, dated Sep. 6, 2021 issued in corresponding Taiwanese Patent Application No. 110112802. English translation of Search report. Total 8 pages.

*Primary Examiner* — Andrew D Graham
(74) *Attorney, Agent, or Firm* — Ostrolenk Faber LLP

(57) ABSTRACT

A molding system for molding electronic components mounted on first and second sides of a substrate has a molding cavity onto which the substrate is locatable for molding. The molding cavity has a first section covering a molding portion of the first side of the substrate, and a second section covering a molding portion of the second side of the substrate. First and second pots have plungers for compressing molding compound placed therein. First and second runners connect the first and second pots to the first and second sections of the molding cavity for introducing the molding compound onto both sides of the substrate. In particular, the runners extend at least from an edge of the substrate along both sides of the substrate to the molding cavity.

17 Claims, 4 Drawing Sheets

(56) References Cited

U.S. PATENT DOCUMENTS

| | | | | |
|---|---|---|---|---|
| 4,629,650 A * | 12/1986 | Kataoka | B29C 48/307 | 264/45.9 |
| 4,812,114 A * | 3/1989 | Kennon | B29C 45/18 | 425/258 |
| 4,900,485 A * | 2/1990 | Murakami | B29C 45/77 | 425/149 |
| 4,946,633 A * | 8/1990 | Saeki | H01L 21/565 | 264/40.5 |
| 4,954,301 A * | 9/1990 | Saeki | H01L 21/67126 | 425/166 |
| 4,954,307 A * | 9/1990 | Yokoyama | B29C 45/1671 | 264/272.17 |
| 4,996,170 A * | 2/1991 | Baird | B29C 45/2725 | 174/521 |
| 5,049,055 A * | 9/1991 | Yokoyama | H01L 21/565 | 264/272.17 |
| 5,123,826 A * | 6/1992 | Baird | B29C 45/02 | 425/572 |
| 5,133,921 A * | 7/1992 | Yokoyama | B29C 45/14655 | 264/272.17 |
| 5,204,122 A * | 4/1993 | Konishi | B29C 45/02 | 264/272.17 |
| 5,297,897 A * | 3/1994 | Venrooij | B29C 43/02 | 425/149 |
| 5,371,044 A * | 12/1994 | Yoshida | H01L 21/565 | 257/667 |
| 5,435,953 A * | 7/1995 | Osada | B29C 45/462 | 264/102 |
| H1654 H * | 6/1997 | Rounds | | 264/272.17 |
| 5,741,530 A * | 4/1998 | Tsunoda | B29C 45/14655 | 425/572 |
| 5,744,083 A * | 4/1998 | Bednarz | B29C 45/2701 | 264/272.17 |
| 5,891,377 A * | 4/1999 | Libres | H01L 21/566 | 264/328.5 |
| 5,955,115 A * | 9/1999 | Bolanos | H01L 21/565 | 264/272.17 |
| 6,106,259 A * | 8/2000 | Lee | B29C 45/02 | 264/272.17 |
| 6,117,382 A * | 9/2000 | Thummel | H01L 21/565 | 264/272.17 |
| 6,245,595 B1 * | 6/2001 | Nguyen | H01L 24/94 | 257/E21.503 |
| 6,261,501 B1 * | 7/2001 | Miyagawa | H01L 21/566 | 264/272.17 |
| 6,287,503 B1 | 9/2001 | Thummel | | |
| 6,683,388 B2 * | 1/2004 | Bolken | H01L 23/4951 | 257/E21.504 |
| 7,887,313 B2 * | 2/2011 | Ogata | B29C 45/021 | 425/149 |
| 8,911,229 B2 * | 12/2014 | Lee | B29C 45/02 | 425/588 |
| 9,076,802 B1 * | 7/2015 | Ko | H01L 21/56 | |
| 2003/0153130 A1 * | 8/2003 | Kuratomi | H01L 24/97 | 257/E21.504 |
| 2003/0228720 A1 * | 12/2003 | Ito | H01L 24/97 | 257/E23.047 |
| 2004/0232527 A1 * | 11/2004 | Ito | H01L 24/97 | 257/E21.504 |
| 2007/0072346 A1 * | 3/2007 | Maeda | H01L 21/565 | 257/E21.504 |
| 2008/0206930 A1 * | 8/2008 | Farnworth | H01L 21/566 | 257/E23.125 |
| 2013/0005087 A1 * | 1/2013 | Chen | H01L 21/565 | 264/272.17 |
| 2013/0140737 A1 * | 6/2013 | Keong | B29C 45/02 | 425/116 |
| 2015/0235994 A1 * | 8/2015 | Ohba | H01L 24/97 | 257/676 |
| 2015/0332986 A1 * | 11/2015 | Tomohiro | H01L 25/0652 | 257/737 |
| 2016/0099159 A1 * | 4/2016 | Gooch | B29C 45/14655 | 425/120 |
| 2016/0211152 A1 * | 7/2016 | Harada | B29C 45/14655 | |
| 2017/0263476 A1 * | 9/2017 | Maeda | B29C 45/14655 | |
| 2018/0021993 A1 * | 1/2018 | Ho | B29C 45/76 | 264/272.15 |
| 2018/0117813 A1 * | 5/2018 | Ho | B29C 45/14639 | |
| 2018/0277404 A1 * | 9/2018 | Gal | H01L 23/28 | |
| 2019/0371625 A1 * | 12/2019 | Sakamoto | H01L 23/48 | |
| 2020/0185291 A1 * | 6/2020 | Ichimura | H01L 23/24 | |

* cited by examiner

DUAL-SIDED MOLDING FOR ENCAPSULATING ELECTRONIC DEVICES

FIELD OF THE INVENTION

The invention relates to the molding of electronic devices during the packaging of electronic devices, and in particular to conducting molding on both sides of a substrate simultaneously.

BACKGROUND AND PRIOR ART

In the semiconductor assembly and packaging industry, it is usually necessary to mold semiconductor and other electronic devices mounted on a substrate with molding compound, such as a resin material, to protect them from the environment. Traditionally, molding had been conducted on electronic devices that are only mounted on one side of the substrate.

However, modern electronic devices may have electronic devices that are mounted on both sides of a substrate, such that molding must be conducted on both sides of the substrate to protect these components from the environment. FIG. 1 is a side view of a dual-sided encapsulated package 10. The dual-sided encapsulated package 10 includes a top package 12 molded onto a first side of a substrate 16, and a bottom package molded onto a second side of the substrate 16 opposite to the first side. The top and bottom packages 12, 14 each encapsulates a plurality of electronic devices, such as semiconductor dice 18, that have been mounted onto both the first and second sides of the substrate 16, with molding compound 20.

Various approaches have been conducted in the prior art to encapsulate both the first and second sides of substrates 16. One approach adopts a multi-step process, wherein each side of the substrate 16 is molded individually in a separate process. The problem is that conducting molding in multiple passes incurs a high risk of deformation and warpage of the substrate 16 from the heat and pressure that is necessary to conduct each pass of the molding process. As such, high manufacturing cost is generally required to minimize package deformation and warpage during dual-sided packaging processes.

It would be beneficial to devise an apparatus for molding both sides of a substrate which is more cost-effective, suitable for high-volume manufacturing and does not require the use of customized materials.

SUMMARY OF THE INVENTION

It is thus an object of the invention to seek to provide an apparatus for molding both sides of a substrate that avoids or ameliorates the shortcomings of the prior art.

According to a first aspect of the invention, there is provided a molding system for molding electronic components mounted on first and second sides of a substrate, the molding system comprising: a molding cavity onto which the substrate is locatable, the molding cavity having a first section covering a molding portion of the first side of the substrate, and a second section covering a molding portion of the second side of the substrate; a first plunger located in a first pot for compressing molding compound placed in the first pot, and a second plunger located in a second pot for compressing molding compound placed in the second pot; a first runner connecting the first pot to the first section of the molding cavity for introducing the molding compound onto the first side of the substrate; and a second runner connecting the second pot to the second section of the molding cavity for introducing the molding compound onto the second side of the substrate; wherein the first runner extends at least from an edge of the substrate along the first side of the substrate to the first section of the molding cavity, and the second runner extends at least from an edge of the substrate along the second side of the substrate to the second section of the molding cavity.

According to a second aspect of the invention, there is provided a molding system for molding electronic components mounted on first and second sides of a substrate, the molding system comprising: a molding cavity onto which the substrate is locatable, the molding cavity having a first section covering a molding portion of the first side of the substrate, and a second section covering a molding portion of the second side of the substrate; a first plunger located in a first pot for compressing molding compound placed in the first pot, and a second plunger located in a second pot for compressing molding compound placed in the second pot; a first runner connecting the first pot to the first section of the molding cavity for introducing the molding compound onto the first side of the substrate; a second runner connecting the second pot to the second section of the molding cavity for introducing the molding compound onto the second side of the substrate; and an interconnect channel connecting the first and second pots to each other, whereby to allow fluid communication between molding compound in the first and second pots.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

An exemplary molding apparatus in accordance with the invention will now be described with reference to the accompanying drawings, in which.

DETAILED DESCRIPTION OF THE PREFERRED EMBODIMENT OF THE INVENTION

Figure 1:
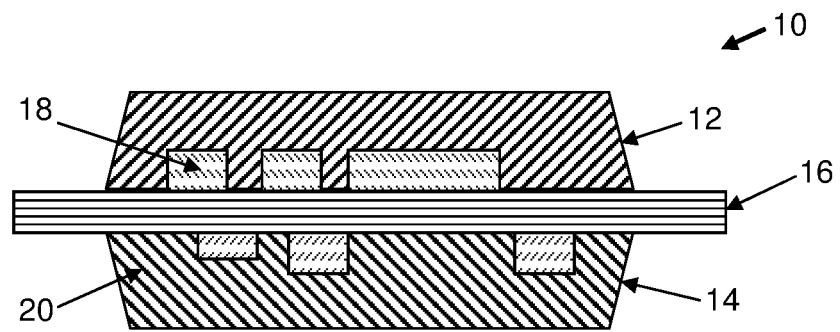
FIG. 1 is a side view of a dual-sided encapsulated package.
Figure 2:
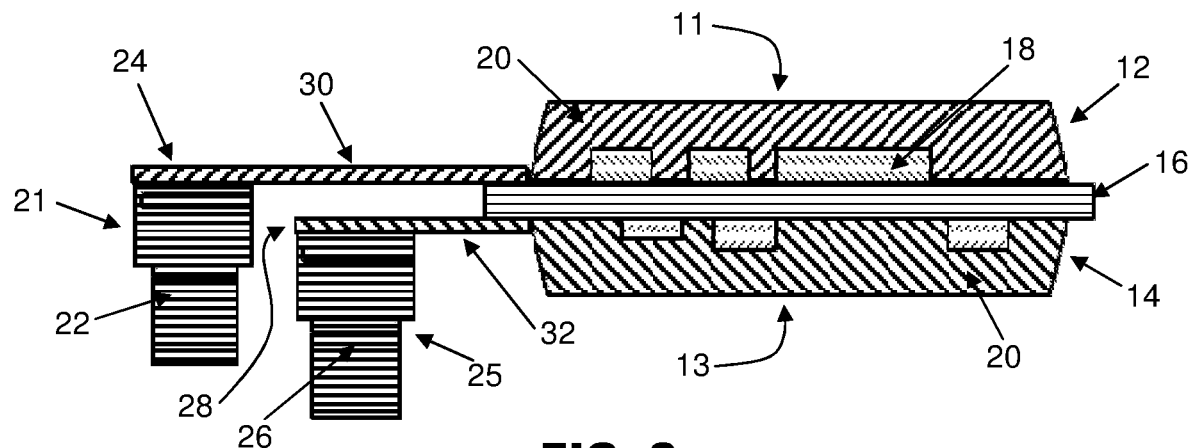
FIG. 2 is a side view of a dual-sided molding system including twin plungers according to the preferred embodiment of the invention.

FIG. 2 is a side view of a dual-sided molding system including twin plungers 22, 26 according to the preferred embodiment of the invention. The molding system is a transfer molding system which comprises a first pot, which may be a top pot 21, in which a first or top plunger 22 is movably located, and a second pot, which may be a bottom pot 25, in which a second or bottom plunger 26 is movably located. A first or top cull 24 is located at an upper surface of the top pot 21, and a first or top runner 30 is connected to it. Likewise, a second or bottom cull 28 is located at an upper surface of the bottom pot 25, and a second or bottom runner 32 is connected to it.

In relation to the molding of a substrate 16, the substrate 16 is locatable in a molding cavity, the molding cavity including a first section in the form of a top cavity 11 covering a molding portion of a first side of the substrate 16, and a second section in the form of a bottom cavity 13 covering a molding portion of a second side of the substrate 16 opposite to the first side. In this configuration, the top runner 30 fluidly connects molding compound in the top pot 21 directly to the top cavity 11 via the top cull 24, and the bottom runner 32 fluidly connects molding compound in the bottom pot 25 directly to the bottom cavity 13 via the bottom cull 28.

The positions of the top and bottom cavities 11, 13 are such that when molding compounds are placed into the top and bottom pots 21, 25, and the top and bottom plungers 22, 26 are moved to compress the molding compounds in the top and bottom pots 21, 25 respectively, the molding compounds in the pots 21, 25 are ejected through the top and bottom runners 32, 34 directly into the top and bottom cavities 11, 13 respectively, to introduce the molding compounds onto both the first and second sides of the substrate 16. After the molding compounds are cured in the top and bottom cavities 11, 13, the molding compounds take the shape of the top and bottom cavities 11, 13 to form molded top and bottom packages 12, 14 respectively. Accordingly, the semiconductor dice 18 on the first and second sides of the substrate 16 are encapsulated by cured molding compound 20.

It would be noted that the top runner 30 extends at least from an edge of the substrate 16 on the first side of the substrate 16 to the top cavity 11, and that the bottom runner 32 extends at least from an edge of the substrate 16 on the second side of the substrate 16 to the bottom cavity 13. This ensures that the top and bottom runners 30, 32 form distinct molding compound channeling paths along the first and second sides of the substrate 16 to avoid the need for a customized material, such as a customized substrate, in order to permit dual-sided molding. The top runner 30 is in contact with the first side of the substrate 16, and the bottom runner 32 is in contact with the second side of the substrate 16, between the edge of the substrate 16 and the molding cavity.

Although, for clarity, the top and bottom pots 21, 25 are shown to be at different heights (in this case the top pot 21 being at a greater height than the bottom pot 25), it is also possible for the top and bottom pots 21, 25 to be arranged at a same height. In this case, the top and bottom runners 30, 32 should be rerouted such that they ultimately run along the top and bottom sides of the substrate 16, at least extending from an edge of the substrate 16 to the molding cavity, to channel molding compound 20 to the top and bottom cavities 11, 13 respectively.

Figure 3:
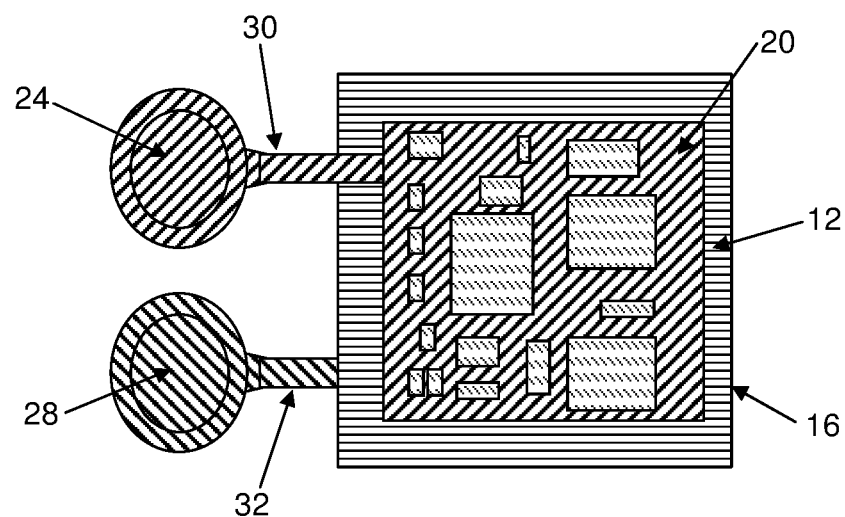
FIG. 3 is a plan view of the dual-sided molding system of FIG. 2.

FIG. 3 is a plan view of the dual-sided molding system of FIG. 2. The cured molding compound 20 has covered the molding portion of the first or top side of the substrate 16, and the molding compound 20 that is formed outside of the molding portion illustrates the flow paths taken by the molding compound 20. Molding compound 20 thus fills the top package 12. The distinct top and bottom runners 30, 32 can be seen as spaced from each other from the plan view, and the top and bottom culls 24, 28 are located at upper surfaces of the top and bottom pots 21, 25. In particular, it can be observed that the top runner 30 is arranged over the first or top side of the substrate 16, extending at least from an edge of the substrate 16 along the first side of the substrate 16, so that the top runner 30 directly connects the top cull 24 to the top cavity 11. On the other hand, the bottom runner 32 is arranged such that a section of the bottom runner 32 extends at least from an edge of the substrate 16 beneath the second or bottom side of the substrate 16, so that the bottom runner 32 directly connects the bottom cull 28 to the bottom cavity 13.

Figure 4:
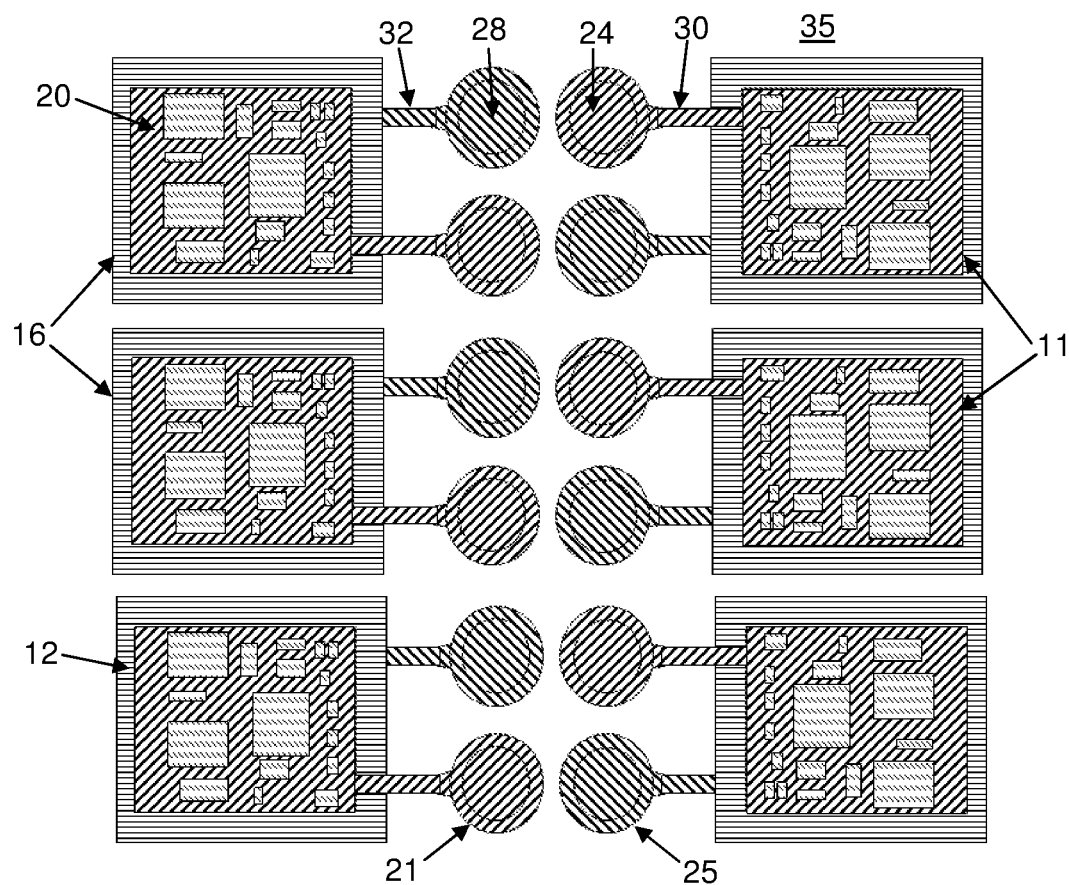
FIG. 4 is a plan view of a surface of a mold chase including multiple dual-sided molding systems according to FIGS. 2 and 3.

FIG. 4 is a plan view of a surface of a mold chase 35 including multiple dual-sided molding systems according to FIGS. 2 and 3. It illustrates two rows of cavities (only the positions of top cavities 11 can be seen from this view) at which multiple substrates 16 are locatable. Illustrated are six molding portions at which top packages 12 on the multiple substrates 16 are encapsulated in the cavities, to form two rows of top packages 12. Centrally-located pairs of top and bottom culls 24, 28 that are connected to each of the top and bottom packages 12, 14 are located in-between the two said rows of top packages 12. As depicted in FIG. 4, there are two rows of centrally-located culls 24, 28 where the pots 21, 25 are located below the culls 24, 28. These pots 21, 25 are arranged between the two rows of bottom cavities 13, and each plunger 22, 26 is positioned in a pot 21, 25 below one of the culls 24, 28. Therefore, in this embodiment, there are cavities arranged in two rows on the surface of the mold chase 35, and two rows of multiple pots 21, 25 are correspondingly arranged in two rows between two rows of cavities.

In respect of each top cull 24, it is fluidly connected directly to each top package 12 on a top surface of the substrate 16, whereas each bottom cull 28 is correspondingly fluidly connected directly to each bottom package 14 on a bottom surface of the substrate 16.

Figure 5:
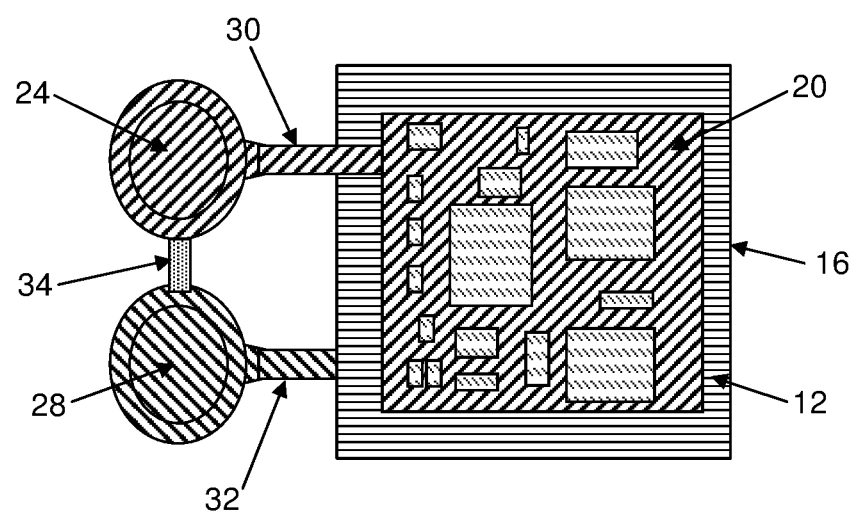
FIG. 5 is a plan view of another preferred embodiment of a dual-sided molding system comprising linked culls.

FIG. 5 is a plan view of another preferred embodiment of a dual-sided molding system comprising linked culls 24, 28. Whilst this embodiment is otherwise similar to the embodiment as illustrated in FIG. 3, the top cull 24 on top of the top pot 21 is linked to the bottom cull 28 on top of the bottom pot 25 by an interconnect channel 34. In other words, the top pot 21 is fluidly connected or linked to the bottom pot 25, so that there is fluid communication between molding compound in the top pot 21 and the bottom pot 25.

A possible issue faced by the previous embodiment of the invention generally illustrated in FIGS. 2 and 3 is that, since the top package 12 and the bottom package 14 are independent of each other, the flows of molding compound from the top and bottom pots 21, 25 to the top and bottom cavities 11, 13 are also independent of each other. In this situation, there is an appreciable risk of deformation and warpage of the top and bottom packages 12, 14 due to unbalanced filling pressure applied by the top and bottom plungers 22, 26. For instance, if molding compound fills the top cavity 11 faster than the bottom cavity 13, a downward pressure will be exerted on the substrate 16 during molding and results in deformation and/or warpage of the substrate 16 towards the bottom cavity 13.

In order to reduce or avoid package deformation and warpage arising from the aforesaid unbalanced filling pressure, the top and bottom culls 34 are advantageously linked together by the interconnect channel 34 to seek to balance and equalize the pressures applied by the top and bottom plungers 22, 26 at each of the top and bottom culls 24, 28.

Figure 6:
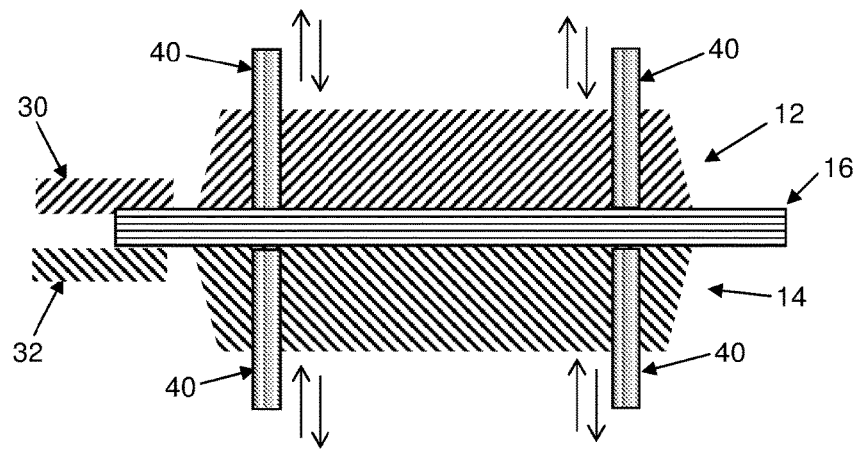
FIG. 6 is a side view of the dual-sided molding system of the invention further comprising retractable pins for supporting the substrate during molding.

FIG. 6 is a side view of the dual-sided molding system of the invention further comprising retractable pins 40 located on the first and second sides of the substrate 16 for clamping onto and supporting the substrate 16 during molding. The retractable pins 40 are incorporated in the molds of the molding system and act as support pillars for the substrate 16 when the retractable pins 40 apply supporting forces on the substrate 16 during molding. The retractable pins 40 provide appropriate support to the substrate 16 to reduce or prevent deformation and warpage of the top and bottom packages 12, 14. For instance, deformation and/or warpage caused by unbalanced forces when molding compound is filling the top and bottom cavities 11, 13 can be better controlled and resisted.

The retractable pins 40 are located outside the molding portions of the first and second sides of the substrate 16, and each pair of retractable pins 40 located on opposite sides of the substrate 16 are arranged collinear with each other. Each said pair of collinear retractable pins 40 will extend to clamp directly on top and bottom surfaces of the substrate 16 after top and bottom molds of the molding system are at a closed position. Hence, the retractable pins 40 are preferably located on top of and below the substrate 16 in relation to the first and second sides thereof, and outside the positions of the top and bottom cavities 11, 13, in order to apply supporting forces on both sides of the substrate 16 onto areas outside the molding portions of the substrate 16 during molding. There should preferably be four pairs of retractable pins 40 interacting on both the first and second sides of the substrate 16, located near corners of the top and bottom packages 12, 14, to provide adequate support to the substrate 16.

When molding compound starts to fill the top and bottom cavities 11, 13, all the retractable pins 40 on both sides of the substrate 16 will be clamping the substrate 16 securely. All the retractable pins 40 will retract after molding compound has fully filled the top and bottom cavities 11, 13, and/or when the top and bottom molds are opened, thereby decreasing the risk of deformation and/or warpage of the substrate 16.

Figure 7:
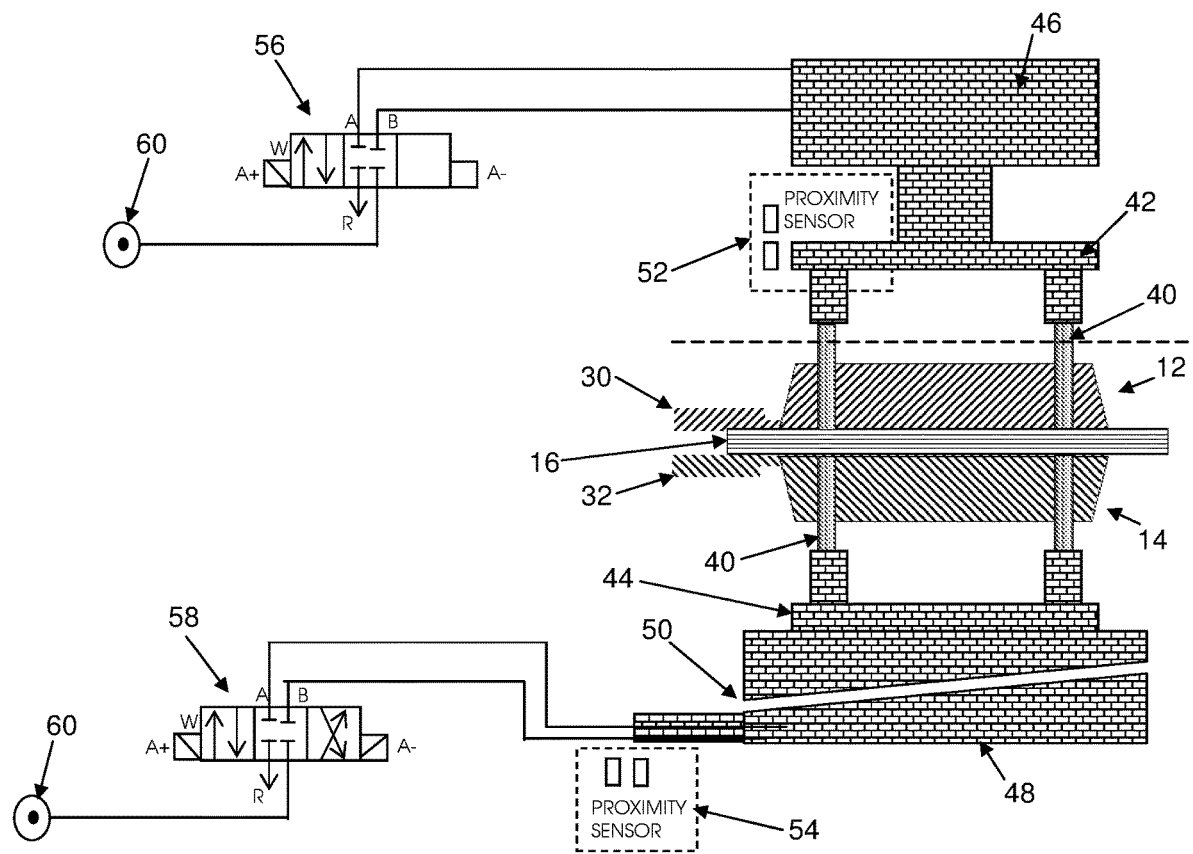
FIG. 7 is a side view of the dual-sided molding system of the invention illustrating actuation mechanisms for controlling the retractable pins of FIG. 6.

FIG. 7 is a side view of the dual-sided molding system of the invention illustrating actuation mechanisms for controlling the retractable pins 40 of FIG. 6. Each retractable pin 40 located on top of the substrate 16 is attached to a first or top retractable pin plate 42 and each retractable pin 40 located below the substrate 16 is attached to a second or bottom retractable pin plate 44. As will be described below, the top and bottom retractable pin plates 42, 44 are operatively connected to actuators for driving the retractable pins 40 to move.

The top retractable pin plate 42 is attached to a top cylinder 46, which can be actuated to move upwards or downwards by a top pneumatic actuator 56. The top pneumatic actuator 56 is operative to lift or lower the top cylinder 46, and hence the retractable pins 40 away from or towards the substrate 16. A pair of top proximity sensors 52 are used to detect positions of the top retractable pin plate 42, preferably at the desired highest and lowest positions of the top retractable pin plate 42, to allow a processor to control the positions of the retractable pins 40 relative to the top of the substrate 16.

The bottom retractable pin plate 44 is attached to a bottom cylinder 48, which may include a wedge mechanism, such as a wedge 50, for converting a horizontal actuation force exerted on the bottom cylinder 48 into a vertical force to move the bottom retractable pin plate 44 and retractable pins 40 upwards or downwards. Consequently, a lower portion of the bottom cylinder 48 can be actuated to move sideways by a bottom pneumatic actuator 58, which in turn results in the lifting or lowering of the bottom retractable pin plate 46. Hence, the retractable pins 40 may be moved towards or away from the substrate 16 by the lifting or lowering of the bottom retractable pin plate 46. A pair of bottom proximity sensors 52 are used to detect horizontal positions of the lower portion of the bottom cylinder 48, preferably at the desired extreme horizontal positions of the bottom cylinder 48, to allow a processor to control the positions of the retractable pins 40 relative to the bottom of the substrate 16.

The top and bottom pneumatic actuators 56, 58 are further connected to air supplies 60 to drive the operation of the actuators 56, 58.

Figure 8:
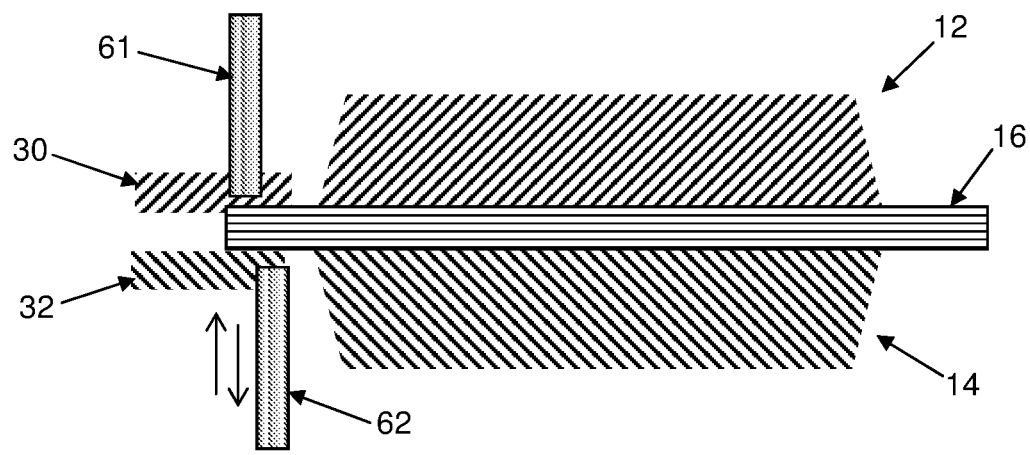
FIG. 8 is a side view of the dual-sided molding system of the invention further comprising movable pin regulators for controlling molding compound flow distribution to a molding cavity.

FIG. 8 is a side view of the dual-sided molding system of the invention further comprising movable pin regulators 61, 62 for controlling molding compound flow distribution to a molding cavity. A top movable pin regulator 61 is insertable into a fluid channel for the top runner 30, and a bottom movable pin regulator 61 is insertable into a fluid channel for the bottom runner 32.

The movable pin regulators 61, 62 act as molding compound flow regulators to control molding compound flow distribution into the top and bottom cavities 11, 13. It is beneficial for the mold flow distribution to be balanced, so that the pressure inside the top and bottom cavities 11, 13 are also balanced. By achieving a balanced mold flow distribution by inserting the movable pin regulators 61, 62 to control the flow of molding compound, the likelihood of unintended package deformation or warpage would be reduced.

In operation, the movable pin regulators 61, 62, which are strategically located along the fluid flow routes of the top and bottom runners, are inserted to predetermined depths into the top and bottom runners 30, 32. The presence of the movable pin regulators 61, 62 will serve to obstruct the flow of molding compound prior to the molding compound entering the top and bottom cavities 11, 13. As a result, the movable pin regulators 61, 62 are configured to act as molding compound flow reducers by either widening or narrowing the pathway for molding compound that is flowing from the top and bottom runners 30, 32 to the top and bottom cavities 11, 13.

Figure 9:
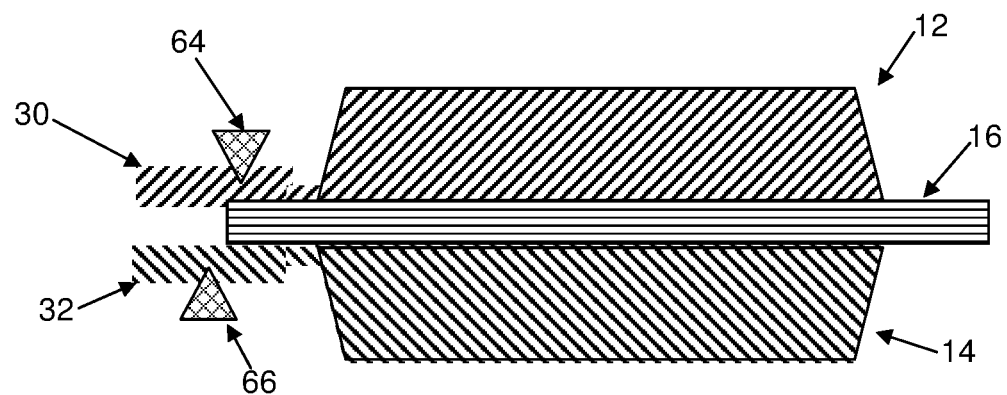
FIG. 9 is a side view of the dual-sided molding system of the invention further comprising mold runner notches for regulating the flow of molding compound to the molding cavity.

FIG. 9 is a side view of the dual-sided molding system of the invention further comprising mold runner notches 64, 66 for regulating the flow of molding compound to the molding cavity. A top mold runner notch 64 protrudes into a fluid channel for the top runner 30, and a bottom mold runner notch 64 protrudes into a fluid channel for the bottom runner 32. Like the movable pin regulators 61, 62, the mold runner notches 64, 66 function to control molding compound flow distribution into the top and bottom cavities 11, 13. However, the mold runner notches 64, 66 are primarily designed to be in fixed positions once they have been installed and adjusted. They obstruct or reduce the flow of molding compound and will assist to promote a balanced mold flow along the top and bottom runners 30, 32 prior to molding compound entering each of the top and bottom cavities 11, 13.

It should be appreciated that the molding system as described in relation to the preferred embodiments of the invention provides a single-step encapsulation process to encapsulate top and bottom packages 12, 14 at the same time using standard tooling. The simplified process results in greater efficiency with standard substrates 16, which need not be customized to be used with the molding system.

The molding system as described can therefore promote lower manufacturing costs, while being robust and suitable for high volume manufacturing.

The invention described herein is susceptible to variations, modifications and/or additions other than those specifically described and it is to be understood that the invention includes all such variations, modifications and/or additions which fall within the spirit and scope of the above description.

The invention claimed is:

1. A molding system for molding electronic components mounted on opposite first and second sides of a substrate, the molding system comprising:
   a molding cavity onto which the substrate is locatable, the molding cavity having a first section covering a molding portion of the first side of the substrate, and a second section covering a molding portion of the second side of the substrate;
   a first plunger located in a first pot for compressing molding compound placed in the first pot, and a second plunger located in a second pot for compressing molding compound placed in the second pot;
   a first runner connecting the first pot to the first section of the molding cavity for introducing the molding compound onto the first side of the substrate; and
   a second runner connecting the second pot to the second section of the molding cavity for introducing the molding compound onto the second side of the substrate;
   wherein the first runner extends at least from a first edge of the substrate along the first side of the substrate to the first section of the molding cavity, and the second runner extends at least from a second edge of the substrate, located directly opposite the first edge on the first side of the substrate, along the second side of the substrate to the second section of the molding cavity.

2. The molding system as claimed in claim 1, wherein the molding system comprises a transfer molding system.

3. The molding system as claimed in claim 1, wherein the first runner is in contact with the first side of the substrate and the second runner is in contact with the second side of the substrate between the edge of the substrate and the molding cavity.

4. The molding system as claimed in claim 1, further comprising an interconnect channel connecting the first and second pots to each other, whereby to allow fluid communication between molding compound in the first and second pots.

5. The molding system as claimed in claim 4, including a first cull portion located on top of the first pot and a second cull portion located on top of the second pot, wherein the interconnect channel extends from the first cull portion to the second cull portion.

6. The molding system as claimed in claim 1, further comprising a plurality of retractable pins located on the first and second sides of the substrate configured to clamp onto the first and second sides of the substrate during molding.

7. The molding system as claimed in claim 6, wherein each pair of retractable pins located on opposite sides of the substrate is arranged collinear with each other for clamping onto the first and second sides of the substrate.

8. The molding system as claimed in claim 6, wherein the retractable pins are located outside the molding cavity to clamp onto areas outside the molding portions of the substrate.

9. The molding system as claimed in claim 6, wherein the molding system includes four pairs of retractable pins interacting on both the first and second sides of the substrate for providing support to the substrate.

10. The molding system as claimed in claim 6, further comprising a first retractable pin plate positioned on the first side of the substrate and a second retractable pin plate positioned on the second side of the substrate to which the plurality of retractable pins are attached, the first and second retractable pin plates being operatively connected to actuators for driving the retractable pins to move.

11. The molding system as claimed in claim 10, further comprising proximity sensors adjacent to the first and second retractable pin plates for detecting positions of the retractable pins relative to the substrate during movement of the retractable pins.

12. The molding system as claimed in claim 10, wherein at least one of the actuators comprises a wedge mechanism for converting a horizontal actuation force into a vertical force to move the retractable pins.

13. The molding system as claimed in claim 1, further comprising at least one movable pin regulator that is insertable into a fluid channel of at least one of the first and second runners, the movable pin regulator being operative to obstruct the flow of molding compound in the fluid channel for regulating a flow of molding compound in the fluid channel.

14. The molding system as claimed in claim 13, wherein a first movable pin regulator is insertable into the first runner and a second movable pin regulator is insertable into the second runner.

15. The molding system as claimed in claim 1, further comprising at least one mold runner notch protruding into a fluid channel of at least one of the first and second runners, the mold runner notch being operative to obstruct the flow of molding compound in the fluid channel for regulating a flow of molding compound in the fluid channel.

16. The molding system as claimed in claim 15, wherein a first mold runner notch protrudes into the first runner and a second mold runner notch protrudes into the second runner.

17. A mold chase including multiple molding systems as claimed in claim 1, wherein multiple molding cavities are arranged in two rows on a surface of the mold chase, and two rows of multiple pots are correspondingly arranged in two rows between two rows of molding cavities.

* * * * *